(12) United States Patent
Hiramatsu (10) Patent No.: US 6,226,574 B1
(45) Date of Patent: May 1, 2001

(54) METHOD FOR TESTING ON-VEHICLE ELECTRONIC UNIT

(75) Inventor: Shinya Hiramatsu, Nagoya (JP)

(73) Assignees: Harness System Technologies Research, Ltd., Nagoya; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/392,732

(22) Filed: Sep. 9, 1999

(30) Foreign Application Priority Data

Feb. 16, 1999 (JP) .................................................. 11-037487

(51) Int. Cl.[7] ...................................................... G06F 7/00

(52) U.S. Cl. ..................... 701/29; 340/825.06; 307/10.1; 324/158.1

(58) Field of Search ................................... 701/1, 29, 33, 701/36; 307/9.1, 10.1; 324/378, 379, 158.1; 340/438, 901, 500, 514, 515, 635, 636, 825, 825.06, 825.16; 702/108, 121

(56) References Cited

U.S. PATENT DOCUMENTS

| | | | |
|---|---|---|---|
| 5,036,479 | * | 7/1991 | Prednis et al. ..................... 324/158.1 |
| 5,177,447 | * | 1/1993 | Marino et al. ........................ 324/713 |
| 5,739,761 | | 4/1998 | Kobayashi ....................... 348/825.16 |
| 6,104,988 | * | 8/2000 | Klarer ................................... 702/183 |

* cited by examiner

Primary Examiner—William A. Cuchlinski, Jr.
Assistant Examiner—Edward Pipala
(74) Attorney, Agent, or Firm—Oliff & Berridge PLC.

(57) ABSTRACT

A method for testing an on-vehicle electronic unit in that while presently available input circuits 11 to 16 and also output circuits 18 to 22 are directly utilized without newly setting an exclusively used interface circuit on the side of an electronic unit 3, a command instruction is applied to these input circuits and output circuits by way of a multiplex serial communication by turning ON/OFF switches 2a to 2f so as to test as to whether or not the switches 2a to 2f are confirmed under normal states by the respective input circuits 11 to 16. Also, a similar operation signal to the switching operation of the switches 2a to 2f is supplied by way of the command instruction by the multiplex serial communication in order to check as to whether or not the output signals derived from the respective output circuits 18 to 22 are proper.

7 Claims, 9 Drawing Sheets

METHOD FOR TESTING ON-VEHICLE ELECTRONIC UNIT

BACKGROUND OF THE INVENTION

The present invention is related to a method for testing an electronic unit mounted on an automobile by using a predetermined test apparatus, which on-vehicle electronic unit is equipped with a plurality of input circuits connected to a plurality of external switches, into which operation signals of the respective external switches are entered; a plurality of output circuits for outputting predetermined output signals to an external unit; and a control unit for controlling said respective output signals derived from said plural output circuits in response to said respective operation signals entered via said plural input circuits.

Conventionally, when an electronic unit is tested, more specifically, a shipping test of the electronic unit is carried out, with respect to functions actually provided with the electronic unit, input logic of switches is made up on the side of the test apparatus so as to perform the test.

Figure 9:
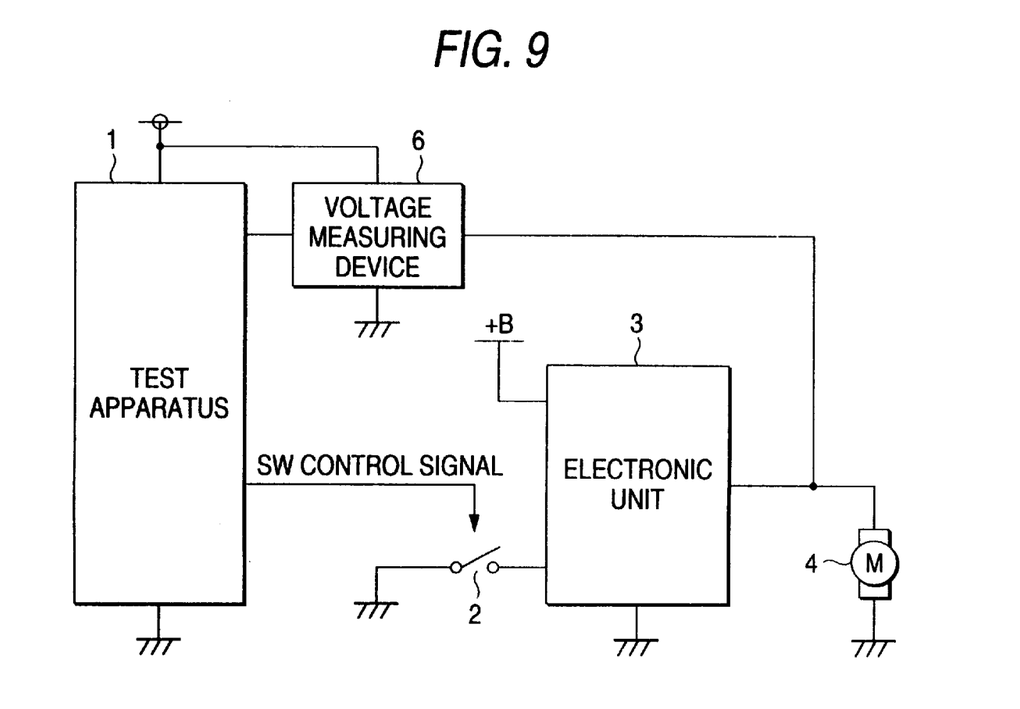
FIG. 9 is the diagram for schematically indicating one example of the conventional method for testing the on-vehicle electronic unit.
Figure 10:
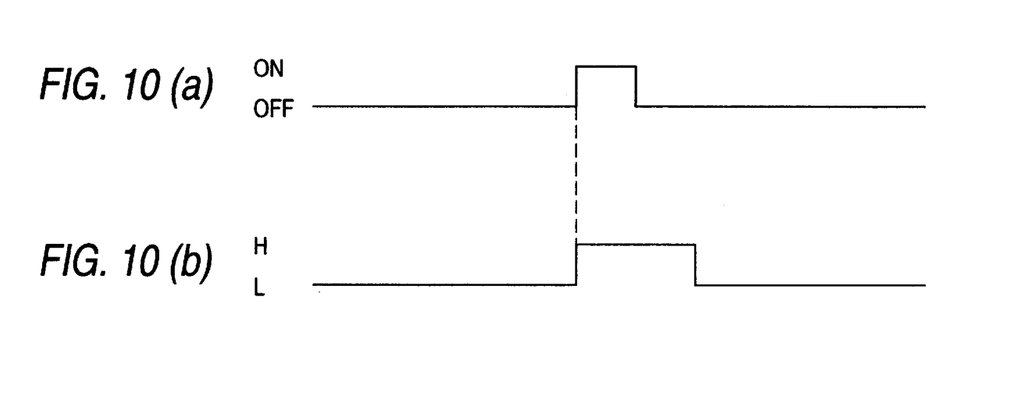
FIG. 10 is a timing chart for representing a relationship between switching operation of switches and output signals derived from the electronic unit.

For instance, as shown in FIG. 9, a confirmation of a door locking function in an automobile is performed as follows. A switch control signal (SW control signal: FIG. 10(a)) is sent out from the test apparatus 1 so as to turn ON/OFF a door locking switch 2, a high (H)/low (L) signal (FIG. 10(b)) derived from this door locking switch 2 is entered into an electronic unit 3. In response to this high/low switch, a confirmation is made as to whether or not the electronic unit 3 drives a door locking motor 4. The test is carried out as to whether or not the input circuits, the CPU, the output circuits, and the like employed in the electronic unit 3 are operated under normal conditions in accordance with the above-described test manner.

Figure 11:
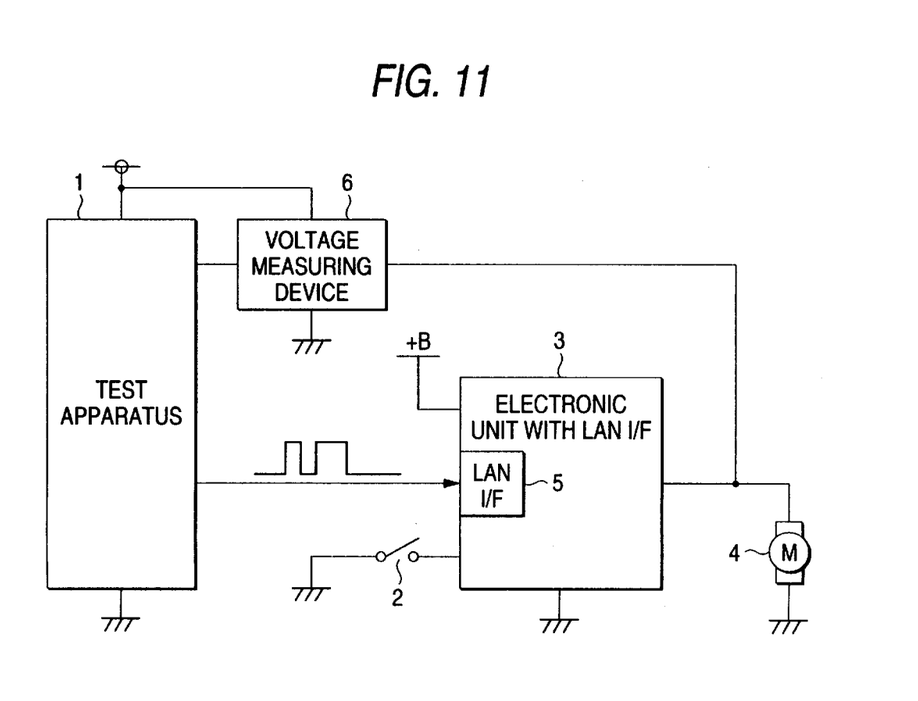
FIG. 11 is a schematic diagram for showing another example of the conventional method for testing the on-vehicle electronic unit.

Also, as shown in FIG. 11, in an electronic unit for mounting an on-vehicle LAN, after the electronic unit 3 has been set in a test mode in accordance with a preselected input sequence, while using a communication input/output interface 5 for the on-vehicle LAN provided in this electronic unit 3, arbitrary switch input information is transmitted as serial data from the test apparatus 1 to the communication input/output interface 5. Since such a test method is carried out, it is possible to perform the test as to whether or not the CPU and the output circuits provided in the electronic unit 3 are operated under normal condition by confirming as to whether or not the electronic unit 3 drives the door locking motor 4 in response to the information contained in the serial data even when the switch 2 is not turned ON/OFF. Also, in this case, the input circuits employed in the electronic unit 3 are tested in such a manner that arbitrary serial data is transmitted from the test apparatus 1 to the communication input/output interface 5 of the electronic unit 3, and furthermore, this input information is returned from the electronic unit 3 as serial data to the test apparatus 1. In accordance with this test method, since the plural input circuits and the plural output circuits can be tested one time, the test time can be advantageously shortened.

It should be noted that reference numeral 6 shown in FIG. 9 and FIG. 11 represents a voltage measuring device for measuring a voltage applied to the electronic unit 3.

Figure 12:
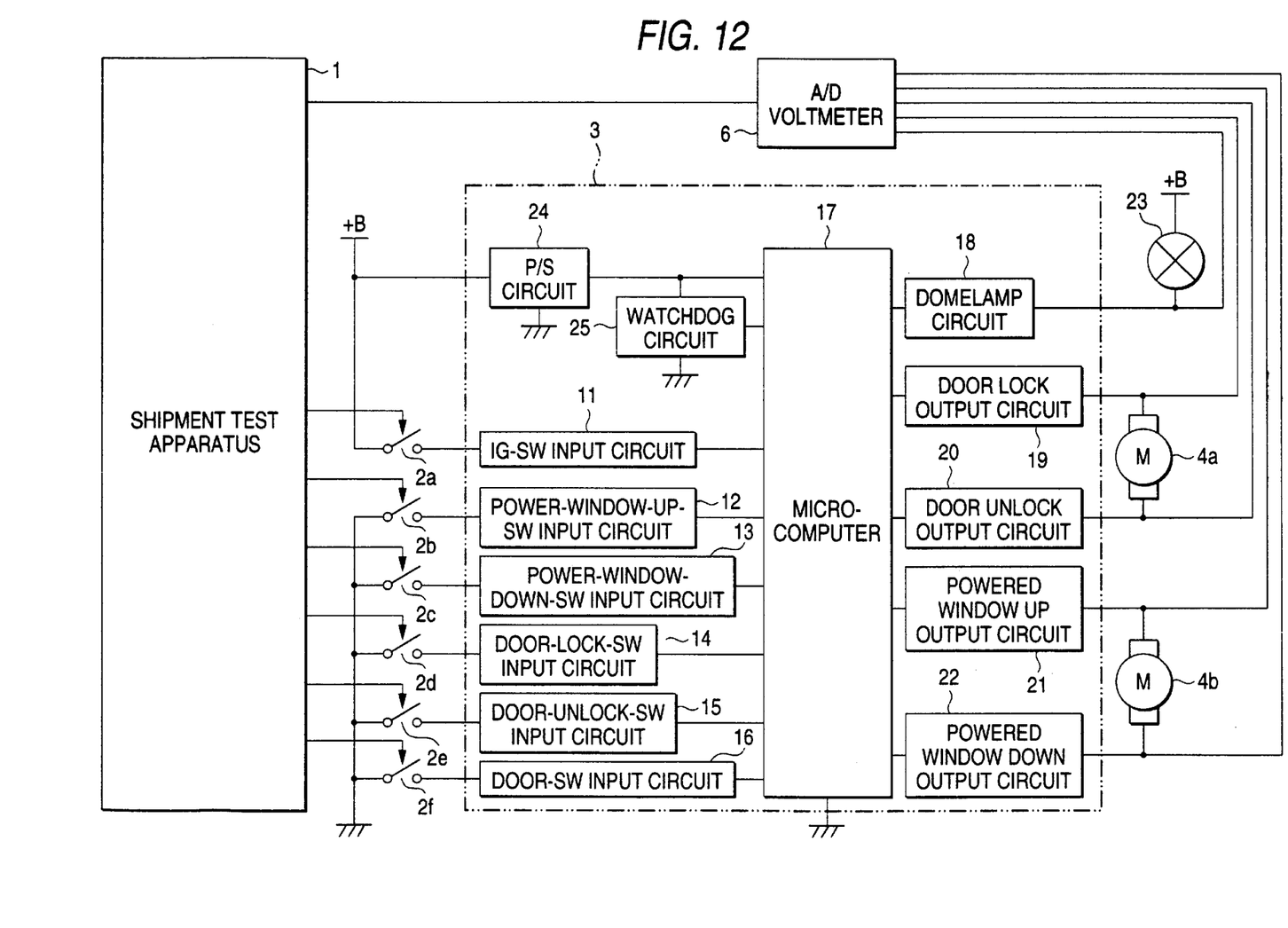
FIG. 12 is a detailed diagram for indicating the electronic unit used in one example of the conventional method for testing the on-vehicle electronic unit.

FIG. 12 is a detailed block circuit for representing the electronic unit 3 contained in the circuit block shown in FIG. 9. A test for the electronic unit 3 shown in FIG. 12 is carried out by separately turning ON/OFF a plurality of switches 2a to 2f by a shipment test apparatus 1. Among these switches 2a to 2f, symbol 2a indicates an ignition switch; symbol 2b shows a powered window up switch; symbol 2c represents a powered window down switch; symbol 2d denotes a door locking switch; symbol 2e shows a door unlocking switch; and symbol 2f represents a door switch. The ignition switch 2a is connected to an ignition switch input circuit (IG-SW input circuit) 11 provided in the electronic unit 3. The powered window up switch 2b is connected to a powered window up switch input circuit (POWER-WINDOW-UP-SW input circuit) 12 employed in the electronic unit 3. The powered window down switch 2c is connected to a powered window down switch input circuit (POWER-WINDOW-DOWN-SW input circuit) 13 employed in the electronic unit 3. The door locking switch 2d is connected to a door locking switch input circuit (DOOR-LOCK-SW input circuit) 14 employed in the electronic unit 3. The door unlocking switch 2e is connected to a door unlocking switch input circuit (DOOR-UNLOCKING-SW input circuit) 15 provided in the electronic unit 3. Then, the door switch 2f is connected to a door switch input circuit (DOOR-SW input circuit) 16 employed in the electronic unit 3. Also, the signals derived from these input circuits 11 to 16 are entered into a control unit (microcomputer chip) 17 containing a ROM, a RAM, and a CPU. While a dome (ceiling) lamp circuit 18, a door locking output circuit 19, a door unlocking output circuit 20, a powered window up output circuit 21, and a powered window down output circuit 22 are controlled by this microcomputer 17, the dome lamp 23, the door locking motor 4a, and the powered window motors 4b are driven, respectively. It should be understood that in FIG. 12, reference numeral 24 denotes a power supply circuit, and reference numeral 25 represents a watch dog circuit for testing a power supply level, and a run-away of the microcomputer 17.

Figure 13:
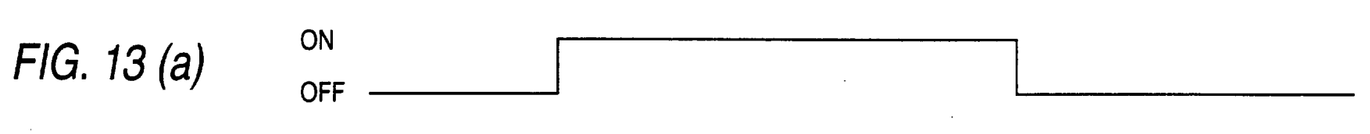
FIG. 13 is a timing chart for showing a relationship among switching operation of switches, input signals to input circuits, and output signals from the electronic unit.

Then, for example, in the case that both the powered window up switch input circuit 12 and the powered window up switch output circuit 21 are tested, after the ignition switch 2a is turned ON as shown in FIG. 13(a) by outputting a signal from the shipment test apparatus 1, the powered window up switch 26 is subsequently turned ON as represented in FIG. 13(b). The test can be carried out as to whether or not the powered window up output circuit 21 is turned ON under normal condition as shown in FIG. 13(c) by checking as to whether or not the power window motor 4b is driven in response to turning-ON of the powered window up switch 2b.

Figure 14:
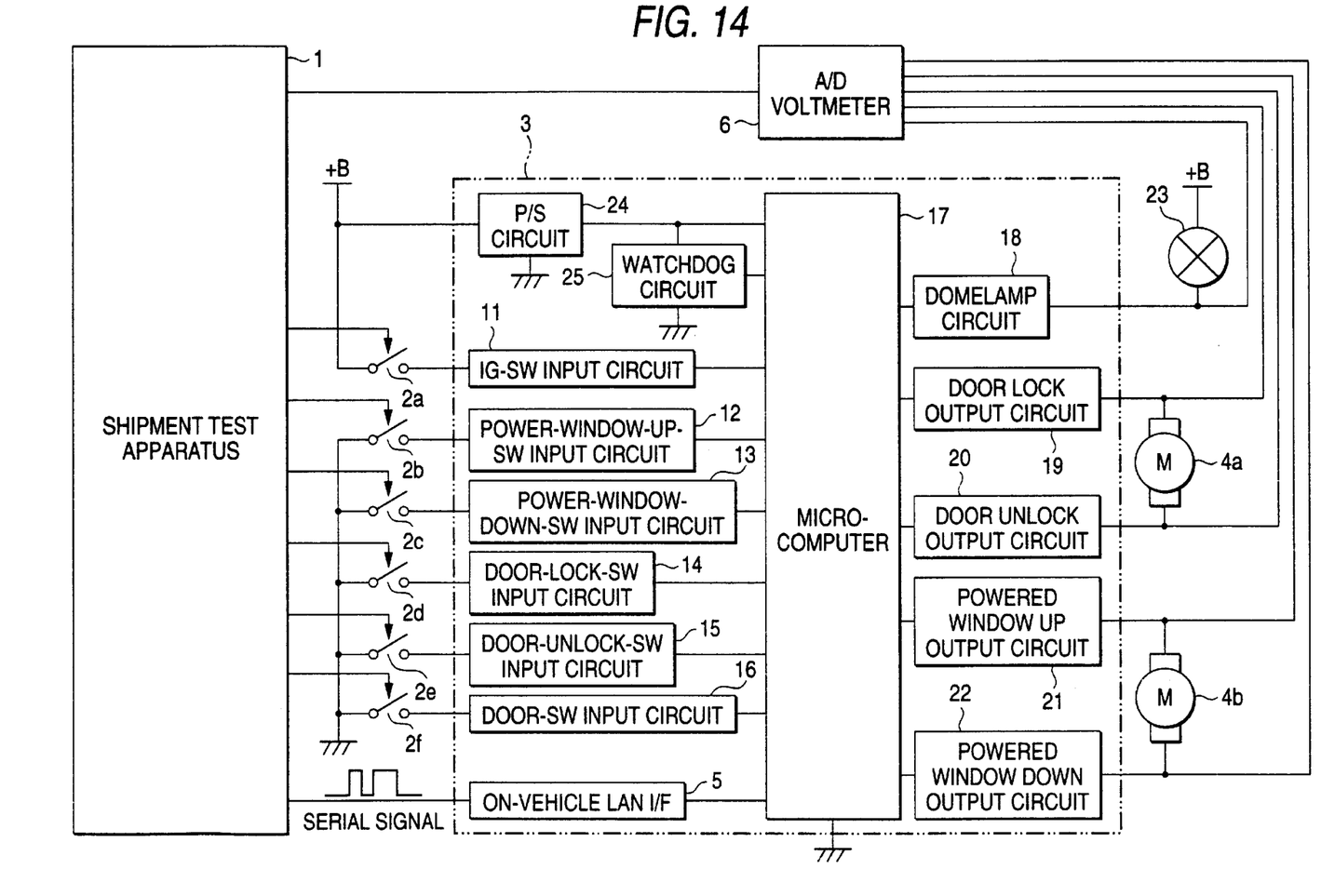
FIG. 14 is a detailed diagram for indicating the electronic unit used in another example of the conventional method for testing the on-vehicle electronic unit.

Also, FIG. 14 is a detailed block diagram for indicating the electronic unit 3 contained in the circuit block shown in FIG. 11. While the electronic unit 3 shown in FIG. 14 is tested, the on-vehicle LAN input/output interface (I/F) 5 exclusively used for testing purposes is installed in the electronic unit 3, and arbitrary switch input information is transmitted in the serial communication from the shipment test apparatus 1 to this on-vehicle LAN input/output interface (I/F) 5. As a result, even when no input signals are entered from the respective switches 2a to 2f, the electronic unit 3 can test the respective output circuits 18 to 22 by confirming that the output in accordance with the serial communication information is executed. Also, while the respective switches 2a to 2f are arbitrarily turned ON/OFF by the shipment test apparatus 1, the arbitrary switch inputs are made in the respective input circuits 11 to 16, and this input information is returned from the output interface 5 of the electronic unit 3 to the shipment test apparatus 1 in the form of serial data. As a result, testing of the respective input circuits 11 to 16 can be carried out. In accordance with this test method, a plurality of input circuits 11 to 16 and also a plurality of output circuits 18 to 22 can be tested within one time.

Very recently, while various sorts of electronic technology has been progressed, various functions provided in automobiles are considerably increased. In connection with this increase of functions, the control circuits employed in the electronic unit 3 are similarly increased. As a result, in accordance with the conventional test method for testing the respective switch inputs and the respective output controls the testing time is increased, and the production ????? is increased, which would induce deteriorations in productivity.

As indicated in FIG. 11 and FIG. 14, if such an electronic unit 3 for mounting the on-vehicle LAN is available, then the test time can be shortened by executing the test method with employment of the communication interface 5 while utilizing the serial communication. However, practically speaking, the electronic unit 3 for mounting the on-vehicle LAN is not so popular.

As a consequence, with respect to such an electronic unit 3 on which the on-vehicle LAN is not mounted, as indicated in FIG. 9 and FIG. 12, the actual input logic signals are entered to the electronic unit 3 by manipulating the switches 2a to 2f so as to test the respective input circuits 11 to 16 and the respective output circuit 18 to 22. Thus, the testing method for performing the test between the electronic unit 3 and the test apparatus 1 by using the serial communication could not be employed.

Alternatively, an interface circuit specific to a test purpose may be additionally employed in the electronic unit 3 on which no on-vehicle LAN is mounted as indicated in FIG. 9 and FIG. 12. In this specific case, there are problems that this electronic unit 3 would become large scale and would require high cost.

SUMMARY OF THE INVENTION

The present invention has been made to solve these problems, and therefore, has an object to provide a method for readily testing an on-vehicle electronic unit within short time. That is, the on-vehicle electronic unit testing/method is realized while avoiding a bulky electronic unit and also an increase of manufacturing cost of the electronic unit.

To solve the above-described problems, an electronic unit testing method of the present invention, is featured by that in a method for testing an on-vehicle electronic unit equipped with a plurality of input circuits connected to a plurality of external switches, into which operation signals of the respective external switches are entered; a plurality of output circuits for outputting predetermined output signals to an external unit; and a control unit for controlling the respective output signals derived from the plural output circuits in response to the respective operation signals entered via the plural input circuits, in which a predetermined test apparatus is connected to the on-vehicle electronic unit so as to test the electronic unit mounted on an automobile, the test apparatus owns a function for performing switching operation of the respective switches; a function for entering a preselected command instruction to a junction point while the test apparatus is connected to the junction point between the respective input circuits of the electronic unit and the respective switches; a function for receiving the respective output signals from the respective output circuits while the test apparatus is connected to the respective output circuits of the electronic unit; and a function for judging as to whether or not the respective output signals derived from the respective output circuit are adapted to either the switch operation of the respective switches or the command instruction entered into the junction point between the respective input circuit and the respective switches; a test step as to the respective input circuits includes: a first input test step for executing the switch operation of the respective switches; a second input test step for entering a command instruction to the junction point between the respective input circuits of the electronic unit and the respective switches, the command instruction instructing that information about condition of the switching operation of the switches with respect to the respective input circuits is returned; a third input test step for receiving the condition information of the switching operation of the switches outputted from the output circuit in response to the command instruction entered at the second input test step; and a fourth input test step for judging as to whether or not the condition information of the switching operation of the switches received at third input test step is adapted to the switching operations of the respective switches at the first input test step; a test step as to the respective output circuits includes: a first output test step for entering as the command instruction a similar operation signal to the operation signal when the switches are switched with respect to the respective input circuits to the junction point between the respective input circuits of the electronic unit and the respective switches; a second output test step for receiving the output signal outputted from the output circuit in response to the command instruction entered at the first output test step; and a third output test step for judging as to whether or not the output signal received at the second output test step is adapted to each of the operation signals as the command instruction at the first output test step.

The on-vehicle electronic unit testing method is featured by that the first input test step included in the test steps as to the respective input circuits performs the switching operations of all of the switches at the same time; the third input test step receives the information about the conditions of the switching operations of the switches outputted from all of the output circuits; and the fourth input test step judges at the same time as to whether or not the condition information of the switching operations of all of the switches received at the third input test step is adapted to the switching operations of all of the switches at the first input test step.

The on-vehicle electronic unit testing method is featured by that the first output test step contained in the test step as to the respective output circuits enters as the command instruction the similar operation signal when the switches are switched with respect to the respective input circuits to all of the junction points between the respective input circuits of the electronic unit and the respective switches; the second output test step receives the output signals outputted from all of the output circuits; and the third output test step judges at the same time as to whether or not all of the output signals received at the second output test step are adapted to all of the operation signals functioning as the command instruction in the first output test steps.

DETAILED DESCRIPTION OF THE PREFERRED EMBODIMENTS

Figure 1:
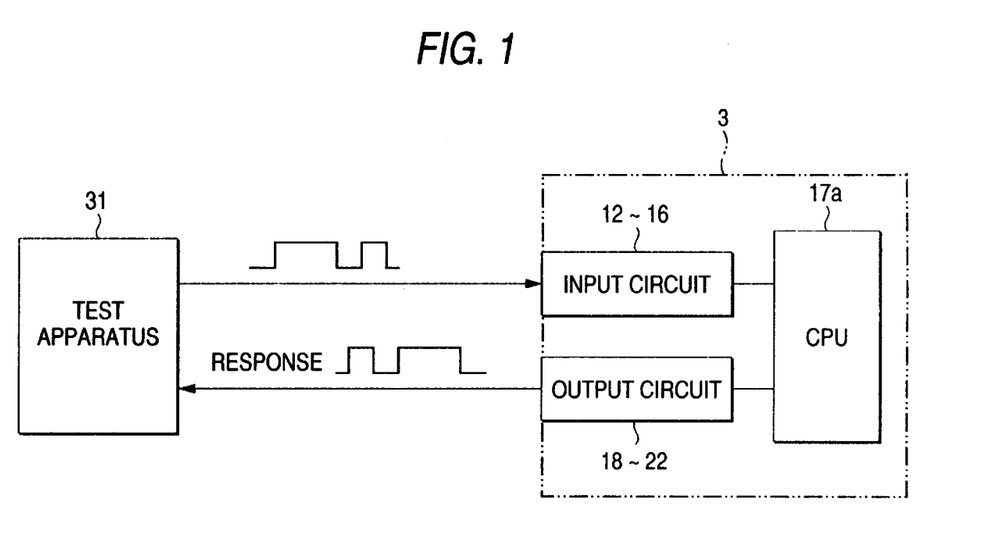
FIG. 1 is a schematic block diagram for showing a method for testing an on-vehicle electronic unit, according to an embodiment of the present invention.

FIG. 1 is a diagram for representing an electronic unit 3 and a test apparatus 31 according to an embodiment mode of the present invention. It should be noted that the same reference numerals of the conventional switches and electronic unit will be employed as those for indicating the same, or similar functions of the electronic unit and switch indicated in FIG. 1.

As indicated in FIG. 1, as to an electronic unit for not mounting an on-vehicle LAN, this method for testing an on-vehicle electronic unit is carried out in such a manner that a serial communication is performed between a test apparatus 31 and the electronic unit 3 by employing presently available input circuits 11 to 16 and presently available output circuits 18 to 22 within this electronic unit 3.

Figure 2:
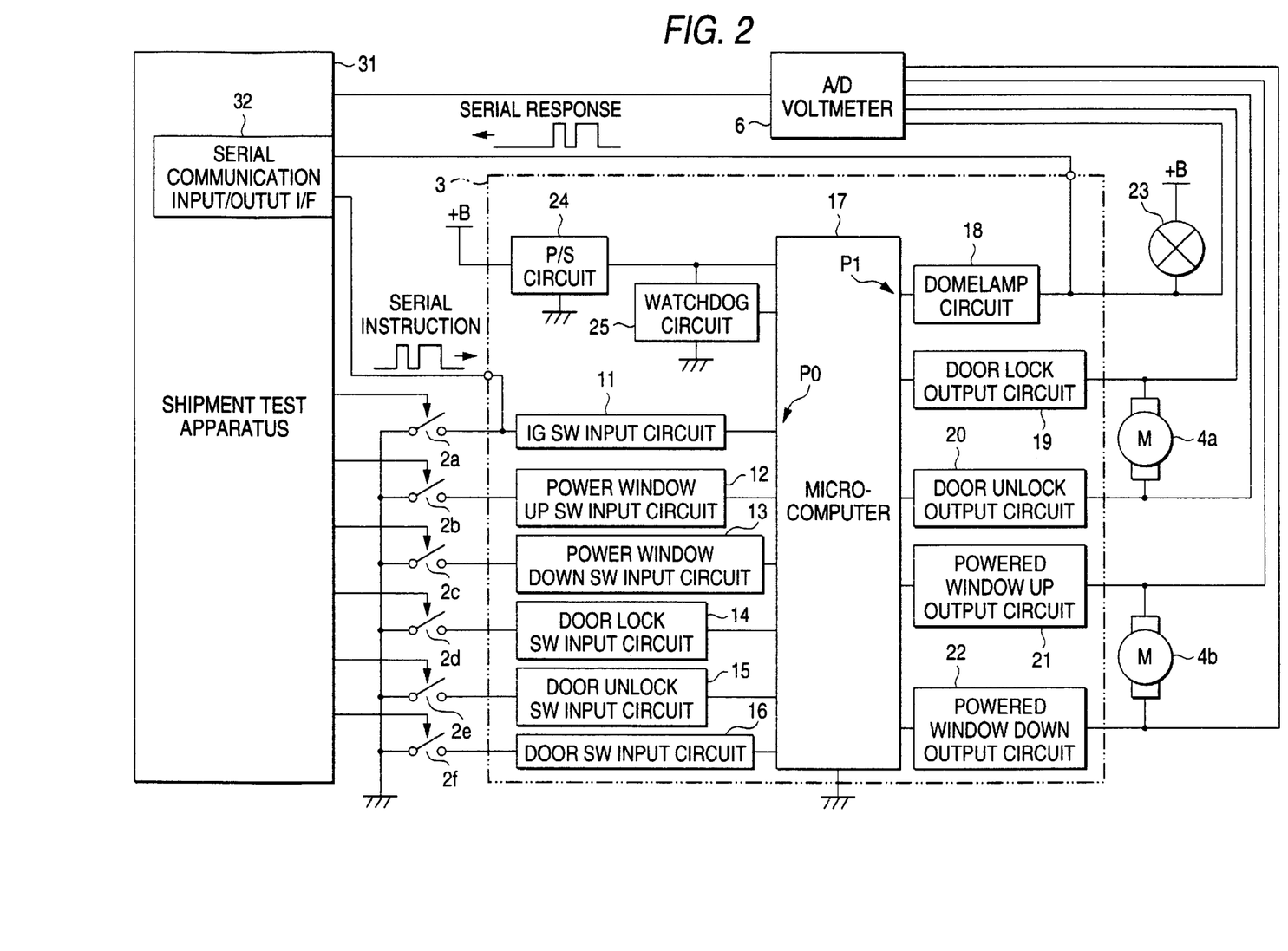
FIG. 2 is a schematic block diagram for showing a wiring relationship when on-vehicle electronic unit according to an embodiment of the present invention is tested.

Concretely speaking, as represented in FIG. 2, in this electronic unit 3, similar to the circuit shown in FIG. 12, the ignition switch 2a is connected to an ignition switch input circuit (IG-SW input circuit) 11 provided in the electronic unit 3. The powered window up switch 2b is connected to a powered window up switch input circuit (POWER-WINDOW-UP-SW input circuit) 12 employed in the electronic unit 3. The powered window down switch 2c is connected to a powered window down switch input circuit (POWER-WINDOW-DOWN-SW input circuit) 13 employed in the electronic unit 3. The door locking switch 2d is connected to a door locking switch input circuit (DOOR-LOCK-SW input circuit) 14 employed in the electronic unit 3. The door unlocking switch 2e is connected to a door unlocking switch input circuit (DOOR-UNLOCKING-SW input circuit) 15 provided in the electronic unit 3. Then, the door switch 2f is connected to a door switch input circuit (DOOR-SW input circuit) 16 employed in the electronic unit 3. Also, the signals outputted from the respective input circuits 11 to 16 are entered into a microcomputer 17 containing a ROM, a RAM, and a CPU. Since a dome (ceiling) lamp circuit 18, a door locking output circuit 19, a door unlocking output circuit 20, a powered window up output circuit 21, and a powered window down output circuit 22 are controlled by this microcomputer 17, the dome lamp 23a, the door locking motor 23b, and the powered window motors 23c are driven, respectively.

In this case, FIG. 2 represents a circuit diagram in such a case that all of the respective input circuits 11 to 16 are connected to the same input port "P0" of the microcomputer 17, and also, all of the output circuits 18 to 22 are connected to the same output port P1 of the microcomputer 17.

Figure 4:
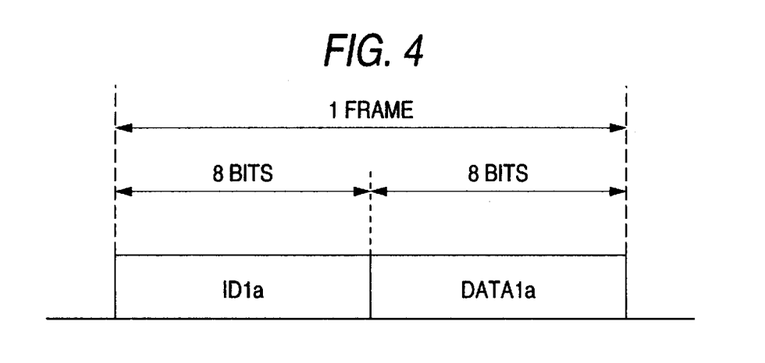
FIG. 4 is a diagram for representing an example of an instruction frame transmitted from a test apparatus to the electronic unit.
Figure 5:
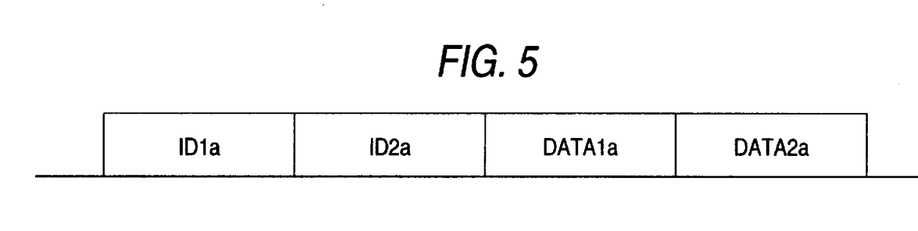
FIG. 5 is a diagram for showing another example of the instruction frame transmitted from the test apparatus to the electronic unit.

The test apparatus 31 is further equipped with a serial communication input/output interface (serial communication input/output interface I/F) 32 with respect to that indicated in FIG. 12. When the respective switches 2e to 2f are the same port, as shown in FIG. 2, a port is designated based upon port designation data (symbols "DATA 1a" and "DATA 2a" as shown in FIG. 4 and FIG. 5) contained in a serial communication signal, and also a predetermined instruction is designated by instruction commands "ID1a" and "ID2a". As a result, operations executed in the electronic unit 3 are designated (will be discussed more in detail).

Then, the test apparatus 31 owns a function for directly and automatically executing switching operations of the respective switches 2a to 2f; a function for entering a preselected command instruction to a junction point while the test apparatus is connected to the junction point between the respective input circuits 11 to 16 of the electronic unit 3 and the respective switches 2a to 2f; a function for receiving the respective output signals derived from the respective output circuits while the test apparatus is connected to the respective output circuits 18 to 22 of the electronic unit 3; and a function for judging as to whether or not the respective output signals derived from the respective output circuits 18 to 22 are adapted to either the switch operations of the respective switches 2e to 2f or the command instruction entered into the junction points between the respective input circuits 11 to 16 of the electronic unit 3 and the respective switches 2a to 2f.

Figure 3:
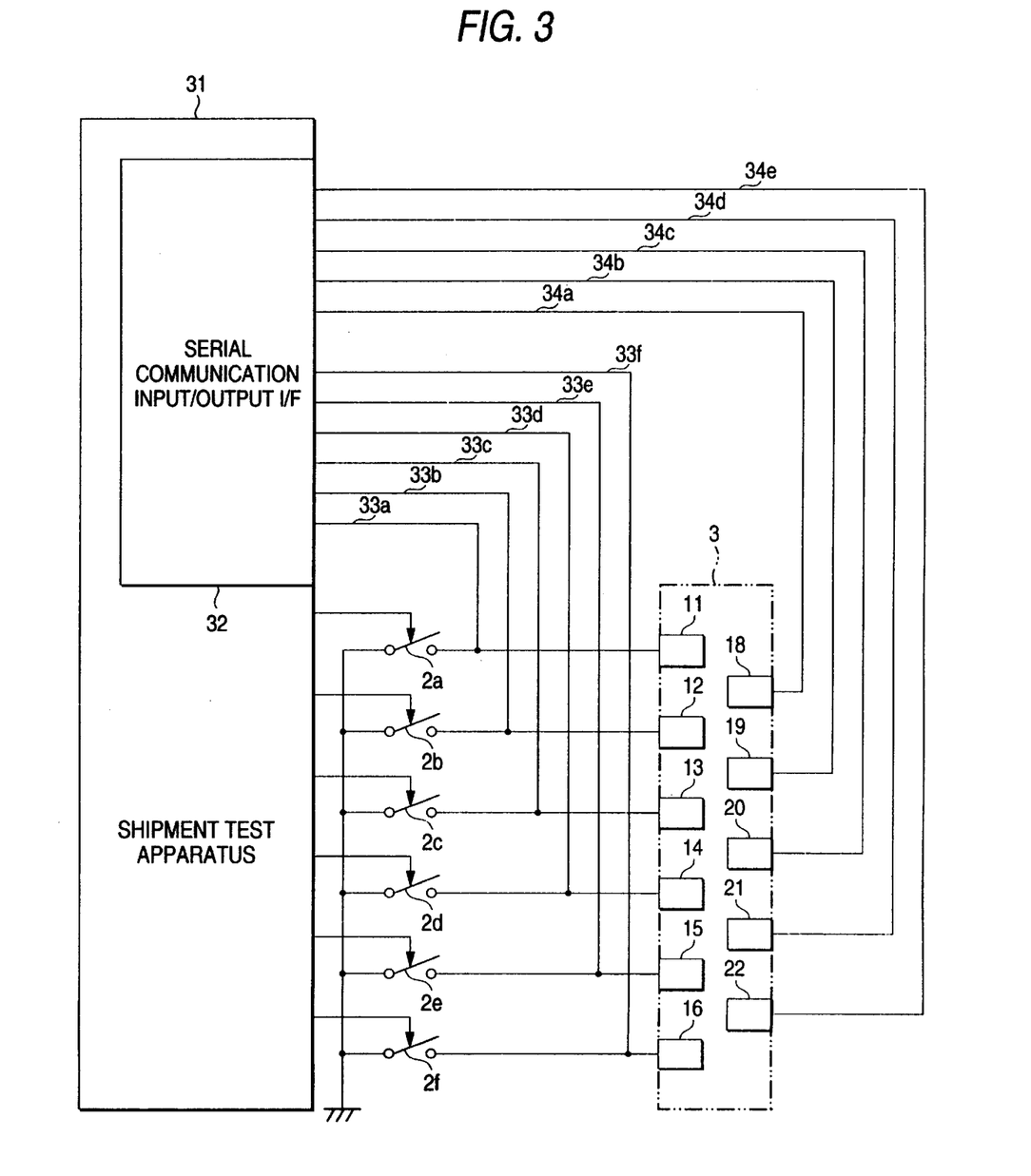
FIG. 3 is a diagram for representing a connection relationship when ports are separately set to the respective input circuits and the respective output circuits.

FIG. 3 is a diagram for representing a connection wiring line arrangement, according to another embodiment, which replaces the above-explained connection relationship. As indicated in FIG. 3, in the case that the respective switches 2a to 2f are connected via different connection terminals to the electronic unit 3, when the commonly used ports P0 and P1 are not used, the below-mentioned circuit arrangement is established. That is, a plurality of connection lines 33a to 33f are arranged in signal paths defined from the serial communication input/output interface 32 of the test apparatus 31 up to the junction points between the respective switches 2a to 2f and the respective input circuits 11 to 16 employed in the electronic unit 3. Also, a plurality of connection lines 34a to 34e are arranged in signal paths between the respective output circuits 18 to 22 employed in the electronic unit 3 and the respective loads 4a, 4b, and 23. Similar to the prior art circuit, the respective switches 2a to 2f are directly turned ON/OFF even by a manual operation (see FIG. 12).

With employment of these circuit arrangement, the electronic unit 3 may be operated not only by turning ON/OFF the respective switches 2a to 2f in response to the above-described operation signal issued from the test apparatus 31, but also by receiving the serial communication signals which are directly supplied from the test apparatus 31 to the respective input circuits 11 to 16. Also, since the serial communication signals derived from the respective output circuits 18 to 22 are supplied to the serial communication input/output interface 32 of the test apparatus 31, the test apparatus 31 may readily confirm as to whether or not the electronic unit 3 outputs in accordance with the serial data information applied to the input circuits 11 to 16. Also, a plurality of input circuits 11 to 16 and a plurality of output circuits 18 to 22 can be tested by directly turning ON/OFF an arbitrary switch of the switches 2a to 2f by the test apparatus 31, and returning the input information from the electronic unit 3 via the connection lines 33a to 33f to the serial communication input/output interface 32 of the test apparatus 31.

As the serial communication system, a specific communication protocol of such a serial communication system is employed in which the test apparatus 31 is used as a master unit and the electronic unit 3 is used as a slave unit. Basically, the below-mentioned communication system is employed. That is, first, an instruction frame is sent from the test apparatus 13 to the electronic unit 3, and the electronic unit 3 returns a response frame to the test apparatus 31. At this time, the electronic unit 3 receives an instruction frame via the presently available input circuits 11 to 16, and transmits a response frame corresponding this instruction frame by using the presently available output circuits 18 to 22. The above-explained test operation is carried out by way of the serial communication in accordance with a software program dedicated to the test purpose, which is prepared in the microcomputer 17 employed in the electronic unit 3, by the operation of the CPU 17a.

Next, a description will now be made of the serial communication protocol. First, as indicated in FIG. 4, the instruction frame sent from the test apparatus 31 to the electronic unit 3 is constituted by the instruction command ID1a having an 8-bit length and indicative of a content of an instruction, and port designation data DATA1a having an 8-bit length. This port designation data DATA1a is used to designate an output port and an input port which is wanted to be test. In this case, a table 1 represents a list of the instruction command ID1a, and a table 2 indicates a list of the port designation data DATA1a.

TABLE 1

| | ID1a | | | | | | | |
|---|---|---|---|---|---|---|---|---|
| instruction name | D7 | D6 | D5 | D4 | D3 | D2 | D1 | D0 |
| request of sending input port data | 0 | 0 | 0 | 0 | 0 | 0 | 0 | 0 |
| request of sending input A/D value | 0 | 0 | 0 | 0 | 0 | 0 | 0 | 1 |
| request outputting of output port | 0 | 0 | 0 | 0 | 0 | 0 | 1 | 0 |
| request ending of test mode | 1 | 1 | 1 | 1 | 1 | 1 | 1 | 1 |

TABLE 2

| Port | DATA1a | | | | | | | |
|---|---|---|---|---|---|---|---|---|
| No. | DAT7 | DAT6 | DAT5 | DAT4 | DAT3 | DAT2 | DAT1 | DAT0 |
| Port 0 | 0 | 0 | 0 | 0 | 0 | 0 | 0 | 0 |
| Port 1 | 0 | 0 | 0 | 0 | 0 | 0 | 0 | 1 |

TABLE 2-continued

| Port | DATA1a | | | | | | | |
|---|---|---|---|---|---|---|---|---|
| No. | DAT7 | DAT6 | DAT5 | DAT4 | DAT3 | DAT2 | DAT1 | DAT0 |
| Port 2 | 0 | 0 | 0 | 0 | 0 | 0 | 1 | 0 |
| Port 15 | 1 | 1 | 1 | 1 | 1 | 1 | 1 | 1 |

In table 1, symbols "D0" to "D7" indicate the respective bit data contained in the instruction command ID1a. In table 2, symbols "DAT0" to "DAT7" indicate the respective bit data contained in the port designation data DATA1a. As to the instruction commands and the port designation data, there are some possibilities that a total number of instruction is desirably increased and the port number is desirably increased, depending upon the unit scale of the electronic unit 3. As a result, as illustrated in FIG. 5, another instruction command ID2a and another port designation data DATA2a may be added to the frame, if required.

Similar to the above-described instruction frame, the response frame supplied from the electronic unit 3 to the test apparatus 31 is constituted by response information ID1b having an 8-bit length and indicative of a content of a response; and also port designation data DATA1b having an 8-bit length and for designation an output port and also an input port to be desirably tested. In this case, a table 3 indicates a list of the response information ID1b, and another table 4 represents a list of the port designation data DATA1b.

TABLE 3

| | ID1b | | | | | | | |
|---|---|---|---|---|---|---|---|---|
| instruction name | D7 | D6 | D5 | D4 | D3 | D2 | D1 | D0 |
| send input port data | 0 | 0 | 0 | 0 | 0 | 0 | 0 | 0 |
| send input A/D value | 0 | 0 | 0 | 0 | 0 | 0 | 0 | 1 |
| send port output | 0 | 0 | 0 | 0 | 0 | 0 | 1 | 0 |
| request ending of test mode | 1 | 1 | 1 | 1 | 1 | 1 | 1 | 1 |

TABLE 4

| Port | DATA1 | | | | | | | |
|---|---|---|---|---|---|---|---|---|
| No. | DAT7 | DAT6 | DAT5 | DAT4 | DAT3 | DAT2 | DAT1 | DAT0 |
| Port 0 | 0 | 0 | 0 | 0 | 0 | 0 | 0 | 0 |
| Port 1 | 0 | 0 | 0 | 0 | 0 | 0 | 0 | 1 |
| Port 2 | 0 | 0 | 0 | 0 | 0 | 0 | 1 | 0 |
| Port 15 | 1 | 1 | 1 | 1 | 1 | 1 | 1 | 1 |

Figure 7:
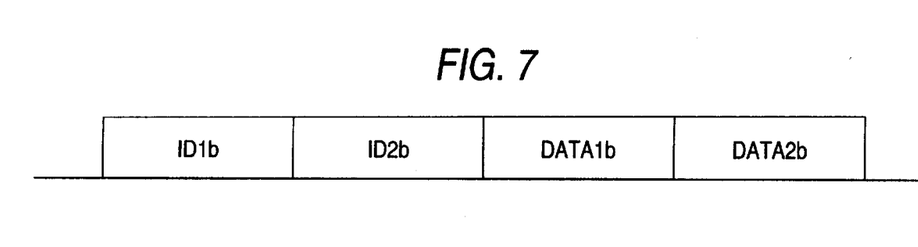
FIG. 7 is a diagram for showing another example of the response frame transmitted from the electronic unit to the test apparatus.

It should be understood that symbols "D0" to "D7" shown in the table 3 indicate the respective bit data contained in the response information ID1b, and symbols "DAT0" to "DAT7" represent the respective bit data contained in the port designation data DATA1b. As to the instruction commands and the port designation data, there are some possibilities that a total number of instruction is desirably increased and the port number is required to be increased, depending upon the unit scale of the electronic unit 3. As a result, as represented in FIG. 7, another response information ID2b and another port designation data DATA2b may be added to the frame, if required.

A description will now be made of operation of the method for testing the on-vehicle electronic unit with employment of the above-described arrangement.

As a first stage, an instruction is issued to the electronic unit 3 to start a test method. In this case, a specific input is given to the electronic unit 3 by turning ON/OFF the predetermined switches 2a to 2f in response to either a serial communication signal or an operation signal supplied from the test apparatus 31. In this case, when such a specific input is supplied to the electronic unit 3 by turning ON/OFF the switches 2a to 2f, the following specific operation is required in order to avoid confusions with the switching operations of the switches 2a to 2f in the normal mode. Otherwise, in order that the operation mode of the electronic unit 3 is not entered into the test mode while the electronic unit 3 is actually operated in the automobile, such an operation of the electronic unit 3 never occurs in view of logical operation under the normal switching operation, for example, all of the switches 2a to 2f are turned ON at the same time.

Figure 8:
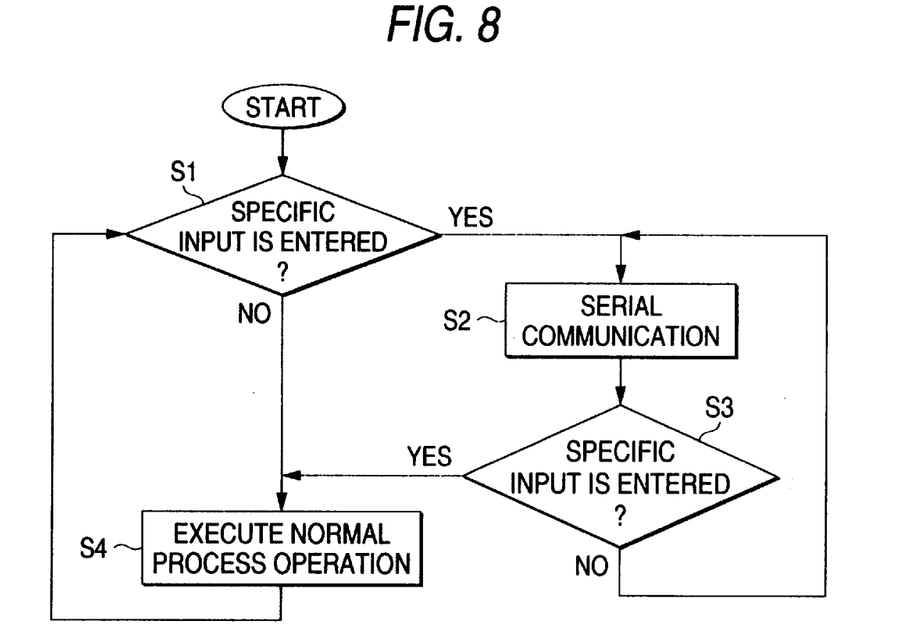
FIG. 8 is a flow chart for describing operations executed when the operation mode is advanced from the normal mode to the test mode.

Then, when the microcomputer 17 provided in the electronic unit 3 judges that the specific input is entered to this electronic unit 3 at a step S1 of FIG. 8, the process operation executed in the microcomputer 17 is switched to the "test mode". Thereafter, at a step S2, such a serial communication signal as indicated in FIG. 4 and the tables 1 and 2 is transmitted from the test apparatus 31 to the electronic unit 3. As will be explained later, the respective input circuits 11 to 16 and the respective output circuits 18 to 22 are tested.

Now, in the case that an intermediate fame "request ending of test mode" indicated in the lowermost column of the table 1 is contained in the serial communication signal derived from the test apparatus 31, the microprocessor 17 judges this fact at a step S3, and switches the operation of the electronic unit 3 from the "test mode" to the "normal mode". Then the test method process operation is advanced to a step S4. At this step S4, the electronic unit 3 receives the instruction signals which instruct originally-implied switching operations of the switches 2a to 2f, so that the normal process operation such as the up/down operations of the powered window and the door locking operation is carried out.

On the other hand, in such a case that the electronic unit 3 receives any instruction frame other that the above-explained instruction frame "request ending of the test mode" indicated in the table 1, which is contained in a serial communication signal supplied from the test apparatus 31, the microprocessor 17 repeatedly executes the process operations defined from the step S1 to the step S3.

Next, process operation executed in the "test mode" will now be explained more in detail. As indicated in FIG. 2, in this test mode, the following initial condition is made. That is, while the ignition switch input circuit 11 is used as an interface for receiving a serial signal sent from the test apparatus 31 and also the dome lamp circuit 18 is employed as an interface for transmitting a serial signal to the test apparatus 31, the respective input circuits 11 to 16 are connected to the same port P0 of the microcomputer 17, and furthermore, all of the output circuits 18 to 22 are connected to the same port P1 of microcomputer 17. Also, as apparent from the foregoing descriptions, the sequential operation of this test mode is not basically changed even in such a case that the microcomputer 17 owns a plurality of input/output ports, whereas both the input circuits 11 to 16 and the output circuits 18 to 22 are connected via a plurality of input/output ports in complex manner.

First, as to the method for testing the input circuit, an operation signal is outputted from the test apparatus 31, so that all of the ignition switch 2a, the powered window up switch 2b, the powered window downs switch 2c, the door locking switch 2d, the door unlocking switch 2e, and the door switch 2f are automatically turned ON. The respective input circuits 11 to 16 employed in the electronic unit 3 transfer present switch conditions of the respective switches 2a to 2f to the microcomputer 17.

Next, an input state returning instruction is transmitted from the test apparatus 31 to the electronic unit 3, and this input state returning instruction is used to return the input state of the port P0 of the microcomputer 17 of the electronic unit 3 to this test apparatus 31. This input state returning instruction is transmitted as the serial communication signal indicated in FIG. 4 to the electronic unit 3.

Figure 6:
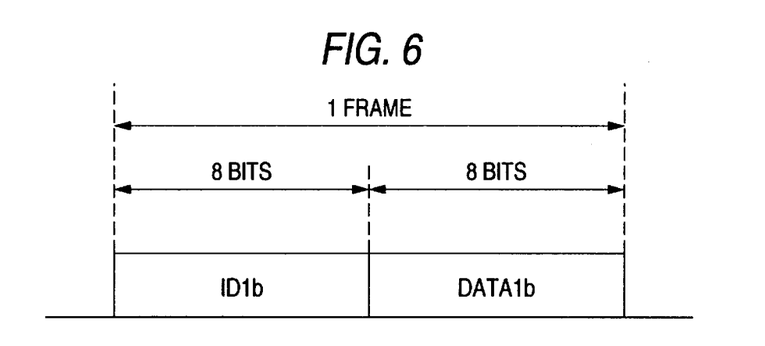
FIG. 6 is a diagram for representing an example of a response frame transmitted from the electronic unit to the test apparatus.

In response to the input state returning instruction sent from the test apparatus 31, the electronic unit 3 transmits the response frame shown in FIG. 6 to the test apparatus 31. This response frame contains detection results made by that the respective input circuits 11 to 16 detect the ON states of the respective switches 2a to 2f.

In response to the response frame sent from the electronic unit 3, the test apparatus 31 judges as to whether or not the ON states of the respective switches 2a to 2f can be detected on the side of the respective input circuits 11 to 16. Concretely speaking, the microcomputer 17 identifies the operation signals outputted from the test apparatus 31 when the test apparatus 31 directly turns ON the switches 2a to 2f with the information stored in the response frame. If the switches 2a to 2f whose ON-states are confirmed by the electronic unit 3 are made coincident with the turned-ON switches 2a to 2f, then it is assumed that these input circuits 11 to 16 can pass the test.

Subsequently, a description will now be made of the method for testing the output circuit.

First, the test apparatus 31 supplies an output instruction as a serial communication signal shown in FIG. 4 to the electronic unit 3. This output instruction is used to output a signal from the port P1 of the microcomputer 17.

In the electronic unit 3, the output instruction sent from the test apparatus 31 and entered into the ignition switch input circuit 11 is received by the microcomputer 17. In response to the output instruction sent from the test apparatus 31, the microcomputer 17 transmits the response frame shown in FIG. 6 via the port P1 and the dome lamp circuit 18 to the test apparatus 31.

In the test apparatus 31, the microcomputer (not shown) of this test apparatus 31 analyzes the response frame which is supplied from the microcomputer 17 of the electronic unit 3 via both the port P1 and the dome lamp circuit 18, and then confirms as to whether or not the output signal is derived from the port P1 corresponding to the output instruction under normal condition. Concretely speaking, the microcomputer of the test apparatus 31 compares the serial communication signal transmitted to the port P0 of the microcomputer 17 employed in the electronic unit 3 with the above-described output signal acquired via both the port P1 and the dome lamp circuit 18, and then judges as to whether or not the correct correspondence relationship can be established based on the signal identification so as to perform the OK/NG judgement. As a result, the microcomputer of the test apparatus 31 can diagnose a failure (NG) occurred in the communication error.

In connection with this judgement, the voltage test which have been conventionally carried out is performed. In other words, an output voltage acquired from the port P1 via the dome lamp circuit 18 is measured by the A/D voltmeter 6, and then is converted into a digital signal by this A/D voltmeter 6. This digital signal is entered into the test apparatus 31. Then, if the value of the acquired output voltage is adapted to the ruled voltage, then it can be assumed that these output circuits 18 to 22 can pass the test.

As previously described in the above embodiment mode, in the case that the input circuits 11 to 16 and the output circuits 18 to 22 are tested by employing the serial communication, even when the switches 2a to 2f are not directly manipulated based on the complex logical theory, a plurality of tests can be executed within a short time period at the same time. As a consequence, the test time can be largely shortened.

Also, since the presently available input circuits 11 to 16 and the presently available output circuits 18 to 22 employed in the electronic unit 3 can be directly utilized in the serial communication executed between the test apparatus 31 and the electronic unit 3, there is no need to newly set the interface circuit dedicated to these input/output circuits. As a result, it can be avoided that the electronic unit 3 becomes bulky and the manufacturing cost thereof is increased.

Furthermore, in the case of the electronic unit 3, there are large possibilities that even an ECU made of a different vehicle sort owns the ignition switch input circuit and the dome lamp output circuit, which are used in the embodiment. As a result, the different sorts of ECUs may be tested by such a way that a single set of test apparatus 31 switches a test program and an external load, which are exclusively designed. Therefore, since the test apparatus 31 need not be newly developed, this may contribute the facility cost down.

In the above-embodiment, the command instruction is given via the terminal unit in the form of the serial communication signal issued from the serial communication I/F 32 of the shipment test apparatus 31. Alternatively, in such a case that the grouding switch 2a and the like are connected to the ignition switch input circuit (IG-SW input circuit) 11, a preselected specific signal may be supplied to the ignition switch input circuit (IG-SW input circuit) 11 by turning ON/OFF the switch 2a and the like in response to the serial signal sent from the serial communication I/F 32 so as to test the electronic circuit. In this alternative case, when the switch 2a and the like may be constituted by a switch element with using a semiconductor such as a transistor, or an electromagnetic relay, the switch 2a and the like can be easily switched in response to the above-explained serial signal. Alternatively, while a command instruction may be manually entered, a human operator may directly turns ON/OFF the switch 2a. In this alternative case, an erroneous operation of the microcomputer 17 can be prevented by entering the command instruction as a specific signal which does not actually appear while the normal switching operation is carried out.

In accordance with the invention, when the respective input circuits are tested, after the switch operation of the respective switches is performed, the command instruction is entered to the junction point between the respective input circuits of the electronic unit and the respective switches. This command instruction instructs that information about condition of the switching operation of the switches with respect to the respective input circuits is returned. The condition information of the switching operation of the switches outputted from the output circuit is received in response to the command instruction, and the microcomputer judges as to whether or not the received condition information of the switching operation of the switches is adapted to the switching operations of the respective switches. Also, when the respective output circuits are tested, as the command instruction, a similar operation signal to the operation signal when the switches are switched with respect to the respective input circuits is entered to the junction point between the respective input circuits of the electronic unit and the respective switches. The output signal outputted from the output circuit is received in response to the command instruction, and the microcomputer judges as to whether or not the received output signal is adapted to each of the operation signals as the command instruction. As a consequence, while the presently available input circuit and also the presently available output circuits are directly utilized without newly setting the dedicated interface circuit to the electronic unit side, these input circuits and also output circuits can be readily tested. Therefore, it can be avoided that the electronic unit becomes bulky, and the manufacturing cost thereof is increased.

In accordance with the invention, since either the plural input circuits or the plural output circuits can be tested at the same time, there is such a merit that the test time can be largely reduced, as compared with the test time required to separately test these input circuits and output circuits.

What is claimed is:

1. A method for testing an on-vehicle electronic unit comprising: a plurality of input circuits connected to a plurality of external switches, into which operation signals of the respective external switches are entered; a plurality of output circuits for outputting predetermined output signals to an external unit; and a control unit for controlling said respective output signals derived from said plural output circuits in response to said respective operation signals entered via said plural input circuits, in which a test apparatus is connected to said on-vehicle electronic unit so as to test the electronic unit mounted on an automobile, said test apparatus having a function for performing switching operation of the respective switches; a function for entering a preselected command instruction to a junction point while said test apparatus is connected to said junction point between the respective input circuits of said electronic unit and the respective switches; a function for receiving said respective output signals from said respective output circuits while said test apparatus is connected to said respective output circuits of said electronic unit; and a function for judging as to whether or not the respective output signals derived from the respective output circuit are adapted to either said switch operation of the respective switches or the command instruction entered into the junction point between said respective input circuit and said respective switches; said testing method comprising the steps of:

a first input test step for executing the switch operation of said respective switches;

a second input test step for entering a command instruction to the junction point between the respective input circuits of the electronic unit and the respective switches, said command instruction instructing that information about condition of the switching operation of said switches with respect to the respective input circuits is returned;

a third input test step for receiving the condition information of the switching operation of said switches outputted from said output circuit in response to the command instruction entered at said second input test step; and a fourth input test step for judging as to whether or not the condition information of the switching operation of said switches received at said third input test step is adapted to the switching operations of said respective switches at the first input test step.

2. A method for testing an on-vehicle electronic unit as claimed in claim 1 wherein: said first input test step included in the test steps as to said respective input circuits performs the switching operations of all of said switches at the same time;

said third input test step receives the information about the conditions of the switching operations of said switches outputted from all of said output circuits; and said fourth input test step judges at the same time as to whether or not the condition information of the switching operations of all of said switches received at said third input test step is adapted to the switching operations of all of said switches at said first input test step.

3. A method for testing an on-vehicle electronic unit comprising: a plurality of input circuits connected to a plurality of external switches, into which operation signals of the respective external switches are entered; a plurality of output circuits for outputting predetermined output signals to an external unit; and a control unit for controlling said respective output signals derived from said plural output circuits in response to said respective operation signals entered via said plural input circuits, in which a test apparatus is connected to said on-vehicle electronic unit so as to test the electronic unit mounted on an automobile, said test apparatus having a function for performing switching operation of the respective switches; a function for entering a preselected command instruction to a junction point while said test apparatus is connected to said junction point between the respective input circuits of said electronic unit and the respective switches; a function for receiving said respective output signals from said respective output circuits while said test apparatus is connected to said respective output circuits of said electronic unit; and a function for judging as to whether or not the respective output signals derived from the respective output circuit are adapted to either said switch operation of the respective switches or the command instruction entered into the junction point between said respective input circuit and said respective switches; said testing method comprising the steps of:

a first output test step for entering as said command instruction a similar operation signal to the operation signal when said switches are switched with respect to said respective input circuits to the junction point between the respective input circuits of said electronic unit and the respective switches;

a second output test step for receiving said output signal outputted from said output circuit in response to the command instruction entered at said first output test step; and a third output test step for judging as to whether or not said output signal received at the second output test step is adapted to each of said operation signals as said command instruction at said first output test step.

4. A method for testing an on-vehicle electronic unit as claimed in claim 3 wherein: said first output test step contained in the test step as to said respective output circuits enters as said command instruction said similar operation signal when said switches are switched with respect to said respective input circuits to all of the junction points between the respective input circuits of said electronic unit and said respective switches;

said second output test step receives said output signals outputted from all of said output circuits; and said third output test step judges at the same time as to whether or not all of said output signals received at said second output test step are adapted to all of said operation signals functioning as said command instruction in said first output test steps.

5. A method for testing an on-vehicle electronic unit comprising: a plurality of input circuits connected to a plurality of external switches, into which operation signals of the respective external switches are entered; a plurality of output circuits for outputting predetermined output signals to an external unit; and a control unit for controlling said respective output signals derived from said plural output circuits in response to said respective operation signals entered via said plural input circuits, in which a test apparatus is connected to said on-vehicle electronic unit so as to test the electronic unit mounted on an automobile, said test apparatus having a function for performing switching operation of the respective switches; a function for entering a preselected command instruction to a junction point while said test apparatus is connected to said junction point between the respective input circuits of said electronic unit and the respective switches; a function for receiving said respective output signals from said respective output circuits while said test apparatus is connected to said respective output circuits of said electronic unit; and a function for judging as to whether or not the respective output signals derived from the respective output circuit are adapted to either said switch operation of the respective switches or the command instruction entered into the junction point between said respective input circuit and said respective switches; said testing method comprising the steps of:

the test step as to the respective input circuits includes:
a first input test step for executing the switch operation of said respective switches;
a second input test step for entering a command instruction to the junction point between the respective input circuits of the electronic unit and the respective switches, said command instruction instructing that information about condition of the switching operation of said switches with respect to the respective input circuits is returned;
a third input test step for receiving the condition information of the switching operation of said switches outputted from said output circuit in response to the command instruction entered at said second input test step; and
a fourth input test step for judging as to whether or not the condition information of the switching operation of said switches received at said third input test step is adapted to the switching operations of said respective switches at the first input test step;

a test step as to the respective output circuits includes:
a first output test step for entering as said command instruction a similar operation signal to the operation signal when said switches are switched with respect to said respective input circuits to the junction point between the respective input circuits of said electronic unit and the respective switches;

a second output test step for receiving said output signal outputted from said output circuit in response to the command instruction entered at said first output test step; and a third output test step for judging as to whether or not said output signal received at the second output test step is adapted to each of said operation signals as said command instruction at said first output test step.

6. A method for testing an on-vehicle electronic unit as claimed in claim 5 wherein:

said first input test step included in the test steps as to said respective input circuits performs the switching operations of all of said switches at the same time;

said third input test step receives the information about the conditions of the switching operations of said switches outputted from all of said output circuits; and said fourth input test step judges at the same time as to whether or not the condition information of the switching operations of all of said switches received at said third input test step is adapted to the switching operations of all of said switches at said first input test step.

7. A method for testing an on-vehicle electronic unit as claimed in claim 5 wherein: said first output test step contained in the test step as to said respective output circuits enters as said command instruction said similar operation signal when said switches are switched with respect to said respective input circuits to all of the junction points between the respective input circuits of said electronic unit and said respective switches;

said second output test step receives said output signals outputted from all of said output circuits; and said third output test step judges at the same time as to whether or not all of said output signals received at said second output test step are adapted to all of said operation signals functioning as said command instruction in said first output test steps.

* * * * *